(12) United States Patent
Brown et al.

(10) Patent No.: US 9,845,643 B2
(45) Date of Patent: Dec. 19, 2017

(54) CABLE FOR AN ELECTRICALLY SUBMERSIBLE PUMP (ESP) ARRANGEMENT

(71) Applicant: Aker Solutions AS, Lysaker (NO)

(72) Inventors: David Brown, Oslo (NO); Lars Bay, Hosle (NO); Kim W. Christensen, Hyggen (NO); Neil Ryan, Holmestrand (NO)

(73) Assignee: Aker Solutions AS, Lysaker (NO)

( * ) Notice: Subject to any disclaimer, the term of this patent is extended or adjusted under 35 U.S.C. 154(b) by 0 days.

(21) Appl. No.: 15/310,621

(22) PCT Filed: May 13, 2015

(86) PCT No.: PCT/EP2015/060649
§ 371 (c)(1),
(2) Date: Nov. 11, 2016

(87) PCT Pub. No.: WO2015/173328
PCT Pub. Date: Nov. 19, 2015

(65) Prior Publication Data
US 2017/0081925 A1    Mar. 23, 2017

(30) Foreign Application Priority Data
May 14, 2014   (NO) .................................. 20140610

(51) Int. Cl.
*H02G 9/00* (2006.01)
*E21B 10/55* (2006.01)
(Continued)

(52) U.S. Cl.
CPC ............ *E21B 10/55* (2013.01); *E21B 10/567* (2013.01); *G06F 17/5018* (2013.01)

(58) Field of Classification Search
CPC .... E21B 17/003; E21B 17/026; E21B 17/028; E21B 33/072; E21B 43/128;
(Continued)

(56) References Cited

U.S. PATENT DOCUMENTS 3,835,929 A * 9/1974 Suman, Jr. ............ E21B 17/003
166/384
5,670,747 A * 9/1997 Lawer ................... E21B 17/023
174/74 R
(Continued)

FOREIGN PATENT DOCUMENTS

| | | |
|---|---|---|
| GB | 2403490 A | 1/2005 |
| WO | 2009/102601 A2 | 8/2009 |
| WO | 2011/146949 A2 | 11/2011 |

OTHER PUBLICATIONS

International Search Report and Written Opinion issued in related PCT Application No. PCT/EP2015/060649 dated Jul. 22, 2015, 9 pages.
(Continued)

*Primary Examiner* — Angel R Estrada
(74) *Attorney, Agent, or Firm* — Baker Botts L.L.P.

(57) ABSTRACT

A cable arrangement for feeding power and signals to downhole equipment, such as an electrically submersible pump (6), within an oil or gas well, comprising an upper suspension element (15), a lower connector (22), a docking station (11') for the downhole equipment coupled to said connector (22), and a cable (8a), comprising lines for power and signal. The cable extends between, and is coupled to, the upper suspension element (15) and the lower connector (22). The docking station (11') is adapted for attachment to the inner surface of a production tubing (5), that a narrow gap is formed between the production tubing (5) and the downhole equipment (6). The cable (8) is shaped to fit inside the gap by having a first dimension in the radial direction of the (Continued)

gap, which is smaller than the gap and a second dimension in the tangential direction of the gap, which is substantially larger than the first dimension.

16 Claims, 6 Drawing Sheets

(51) Int. Cl.
*E21B 10/567* (2006.01)
*G06F 17/50* (2006.01)

(58) Field of Classification Search
CPC .... E21B 17/006; E21B 33/076; E21B 33/064; E21B 43/129; H01B 7/08; H01B 7/18; H01B 7/0208; H01B 7/04; H01B 7/1805; H02G 9/06; H02G 9/10; H02G 9/00; H02G 9/02; H02G 9/12; H02G 3/04
USPC .. 174/370, 68.1, 68.3, 72 A, 73.1, 74 R, 37; 166/369, 370, 375, 335, 385, 77.1, 77.2; 248/68.1, 56
See application file for complete search history.

(56) References Cited

U.S. PATENT DOCUMENTS

| | | | | |
|---|---|---|---|---|
| 6,148,925 | A * | 11/2000 | Moore | E21B 17/206 16/81 |
| 6,192,983 | B1 | 2/2001 | Neuroth et al. | |
| 7,264,061 | B2 * | 9/2007 | Dybevik | E21B 17/026 166/133 |
| 7,420,121 | B2 * | 9/2008 | Tezuka | E21B 17/023 174/74 R |
| 7,533,461 | B2 * | 5/2009 | Griffiths | E21B 17/028 166/381 |
| 7,544,105 | B2 * | 6/2009 | Stagi | H01R 4/20 174/74 R |
| 2010/0206577 | A1 | 8/2010 | Martinez | |
| 2014/0102721 | A1 | 4/2014 | Bespalov et al. | |

OTHER PUBLICATIONS

Search Report issued in related Norwegian Application No. 20140610 dated Dec. 11, 2014, 2 pages.

* cited by examiner

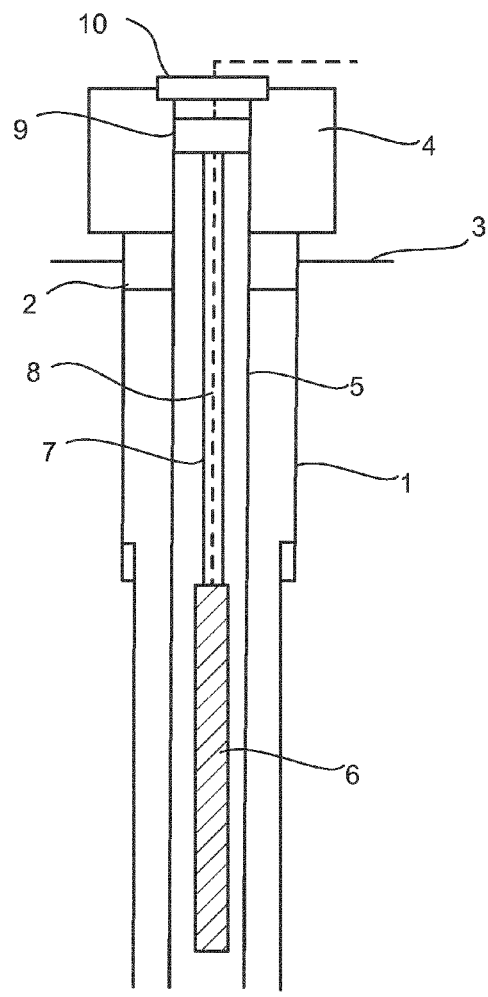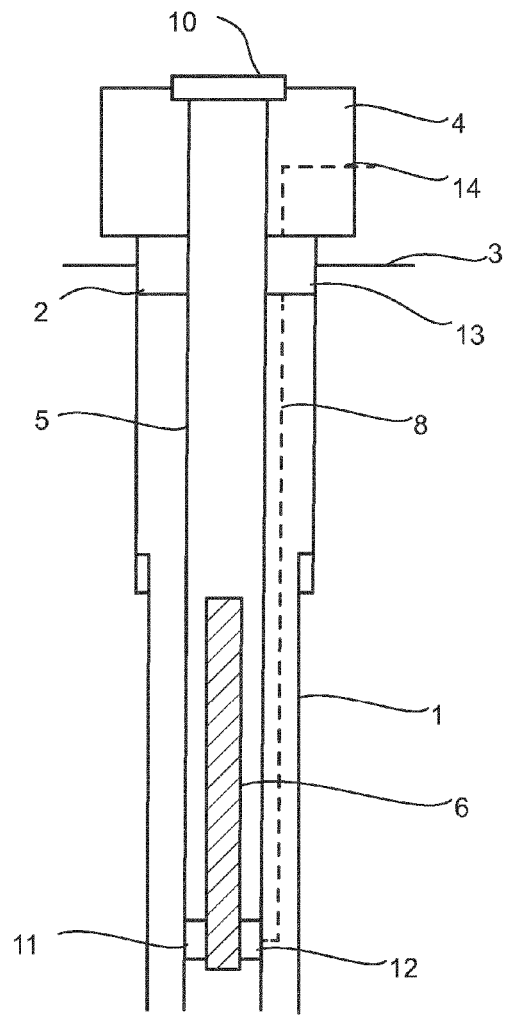
FIG. 1
(Prior art)
FIG. 2
(Prior art)

CABLE FOR AN ELECTRICALLY SUBMERSIBLE PUMP (ESP) ARRANGEMENT

CROSS-REFERENCE TO RELATED APPLICATION

The present application is a U.S. National Stage Application of International Application No. PCT/EP2015/060649 filed May 13, 2015, which claims priority to NO Application No. 20140610 filed May 14, 2014, both of which are incorporated herein by reference in their entirety for all purposes.

An Electrical Submersible Pump (ESP) is a unit, comprising a pump and an electric motor that is installed in a production tubing to boost the recovery rate from an oil or natural gas well. The ESP is placed downhole in the well as deep as several thousand meters. The ESP motor requires high levels of electrical power. This power is fed to the pump unit through a cable, which must be routed either inside or outside of the production tubing and through the Christmas tree (XT). Currently there are two main methods for routing power and signal cables down to an Electrical Submersible Pump (ESP), viz. internal and external cabling. Both systems have limitations to their use, as will be described below.

Internal Cabling:

FIG. 1 shows the principles of the internal cabling method. The figure shows a well casing 1 that extends into the ground from a wellhead 2 arranged at the seabed 3. On top of the wellhead 2 is a Christmas tree 4. A production tubing 5 extends from the Christmas tree into the well on the inside of the casing. A pump unit 6 (sometimes called ESP) is situated within the production tubing. The Pump unit 6 is suspended from a coiled tubing 7. A signal and power cable 8 is situated within the coiled tubing 7. The coiled tubing is suspended in a hanger plug 9, which has been landed inside the Christmas tree 4. The cable 8 extends through a tree cap 10, and then up to the sea surface (not shown). The tree 4 is a horizontal Christmas tree. It is theoretically feasible, but highly unpractical to use this technique on a vertical Christmas tree due to the smaller production bore size of the vertical Christmas trees.

The major disadvantage of this method of suspending the pump unit 6 is the challenge met during installation of the system and the difficulties in replacing the ESP when it fails. In addition, it requires the use of coiled tubing for installation because of its greater tensile capacity compared to wireline. The weight of the complete system (mainly due to the heavy coiled tubing) gives limitations to the installation depth. The installation is very difficult to perform on live wells, as the system is dependent on the closing of downhole valves to close the well below the location of the ESP. This makes the system less robust, and the options for contingency operations are limited. The replacement of the pump unit 6 is complex and costly. The reliability of downhole valves for closing the well below the pump unit is questionable, and if the downhole valve should fail, contingency is lost and an expensive operation is necessary to replace the valve.

External Cabling:

FIG. 2 shows a second alternative in established prior art. The well casing 1, wellhead 2, Christmas tree 4 and production tubing 5 are the same as in FIG. 1. In the external cabling method, the pump unit has been landed on a docking station 11. The docking station has been installed together with the production tubing and includes a penetration through the production tubing with a wet mate connection 12 for connecting the power and signal cable 8 to the ESP.

The cable 8 is routed on the outside of the production tubing 5, i.e. in the annulus between the production tubing 5 and the casing 1. It extends through a penetration 13 in the wellhead 2 and through a penetration 14 in the Christmas tree 4. Systems of this type are described in US20100707843 and US20100835578.

The penetration through the production tubing requires that the external cabling option infrastructure must be installed with the production tubing. As the completion must be specially made for the purpose, it requires changing the completion (inter alia the production tubing) if it is to be retrofitted on existing wells. This makes this method very costly to install in brownfields. The Christmas tree must also be replaced, as most trees do not have the required feed-through for a power and signal cable. If the docking station or cable is damaged and ceases to function, the whole completion must also be changed.

In a simultaneously filed patent application with the title, "Electrically submersible pump (ESP) arrangement", describes a new arrangement for an ESP unit. The present invention is directed to a power and signal cable that is particularly suitable for this novel arrangement. However, the cable may also be used for other purposes where lack of space is an issue.

The novel arrangement of the ESP is developed to enable fast and efficient first-time installation using a conventional open water workover system or a riser-less well intervention (RLWI) system on live wells, especially without the need to use downhole valves). It enables fast change-out of the ESP unit, which is important, as ESP's are known to fail frequently. The system will be beneficial for both green, i.e. new, and brown, i.e. old, fields, and does not require change-out of either the Christmas tree or the completion. It can be used on both horizontal Christmas trees (HXT) and vertical Christmas trees (VXT), although as mentioned earlier, it is probably most beneficial on HXTs due to the larger production bore size that is available. The concepts of the invention will have significant benefits compared to the previously described internal and external cabling options.

Some of the advantages possible with the novel arrangement are:
- Enabling re-use of existing completions
- Enabling re-use of existing Christmas trees
- Can be used on both vertical and horizontal Christmas trees
- Easier first-time installation of the system according to the invention compared to conventional internal and external cabling options. The installation can be performed using conventional workover systems.
- Easy replacement of the ESP, using either an open water workover system or a riser-less workover system
- A reliable system, which is not dependent on down-hole valves
- Possible to change docking station (including the wet mate connection) without pulling the completion The novel system may in its most elaborate aspect comprise four main parts:
1. A Christmas tree adapter with a feed-through of a power and signal cable.
2. A power and signal cable suspended from the Christmas tree adapter.
3. A docking station for the pump unit.
4. A per se conventional pump unit.

With the novel system generally described above the power and signal cable will extend between the pump unit and the inner wall of the production tubing. The space in this area is sparse, which means that the cable must have a rather small diameter, or the diameter of the pump must be reduced. A smaller diameter pump will reduce the effectiveness of the pump. A narrow cable means that the power lines may be of limited cross-section, which in turn has a negative impact on the effect of the electric motor and hence the pump capacity. There is also a limit on the size and number of signal cables.

Another challenge with this arrangement is that during ESP installation or retrieval, there is risk that the pump unit will snag on the cable and damage it, causing costly delays to the installation process.

Consequently, there is a desire to develop a novel cable, which can carry a greater cross-section of power lines and a greater number of signal cables within the space available between the pump unit and the production tubing.

There is also a desire to be able to increase the diameter of the pump unit to allow for a pump with a higher capacity.

This is achieved by a cable arrangement for feeding power and signals to downhole equipment, such as an electrically submersible pump, within an oil or gas well, comprising an upper suspension element, a lower connector, a docking station for the downhole equipment coupled to said connector, and a cable, comprising lines for power and signal, extending between and being coupled to said upper suspension element and said lower connector, wherein the docking station is adapted for attachment to the inner surface of a production tubing, that a narrow gap is formed between said production tubing and said downhole equipment, said cable is shaped to fit inside said gap by having a first dimension in the radial direction of said gap, which is smaller than said gap and a second dimension in the tangential direction of said gap, which is substantially larger than said first dimension.

Thereby, it is possible to install a larger equipment unit, e.g. a pump unit with a greater diameter.

Preferably, the cable is ring-shaped with a central void that is at least as large as the outer dimension of said downhole equipment, and that said lines are distributed along the circumference of said cable.

Thereby the equipment can be installed through the central void of the cable.

By providing the cable with an outer sleeve and an inner sleeve and arranging said lines between said sleeves, the lines will be protected and prevented from entangling.

In one embodiment, the sleeves comprise fibres that, over at least a part of the cable length, are wound helically or as Z-winding.

Thereby the cable will be more flexible and easy to wind up on a reel.

If the cable is collapsible into a generally flat configuration, it will be even easier to reel onto a cable drum.

If the lines on one side of the cable when collapsed are pushed into gaps between lines on the opposite side of the cable, the cable can be wound even tighter on the cable drum.

In an alternative embodiment, the lines are placed in one or more clusters, each cluster having a semi-circular shape with a radius substantially the same as the gap between the downhole equipment and the production tubing.

This allows for a cable that can be arranged on one side of the production tubing.

In one embodiment, the cable is attached to one or more ring-shaped or semi-ring-shaped spring elements that acts to push the cable against the inner surface of said production tubing.

Thereby the cable will not interfere with the well flow or operations through the production tubing.

In an alternative embodiment, the cable is attached to a helical spring element that acts to push the cable against the inner surface of said production tubing.

Thereby the cable will not interfere with the well flow or operations through the production tubing.

The spring element may be made of a memory alloy, which causes the cable to expand after the insertion into the well.

In yet another embodiment, the cable is equipped with permanent magnets or electro magnets that attaches said cable to the inner surface of the production tubing.

Thereby the cable will not interfere with the well flow or operations through the production tubing.

In still another embodiment, the cable has an outer geometry that creates a radial force when said cable is subjected to a well flow, in order to push said cable against the inner surface of said production tubing.

Thereby the cable will not interfere with the well flow or operations through the production tubing.

The cable may also comprise elongate strength elements.

Thereby, the cable will have load-bearing capacity and can be used for suspending equipment to be installed.

The invention will now be described in more detail, referring to the enclosed drawings, in which:

FIG. 1 shows internal cabling used to route power and signal cables to an electrical submersible pump.

FIG. 2 shows external cabling used to route power and signal cables to an electrical submersible pump.

Figure 3:
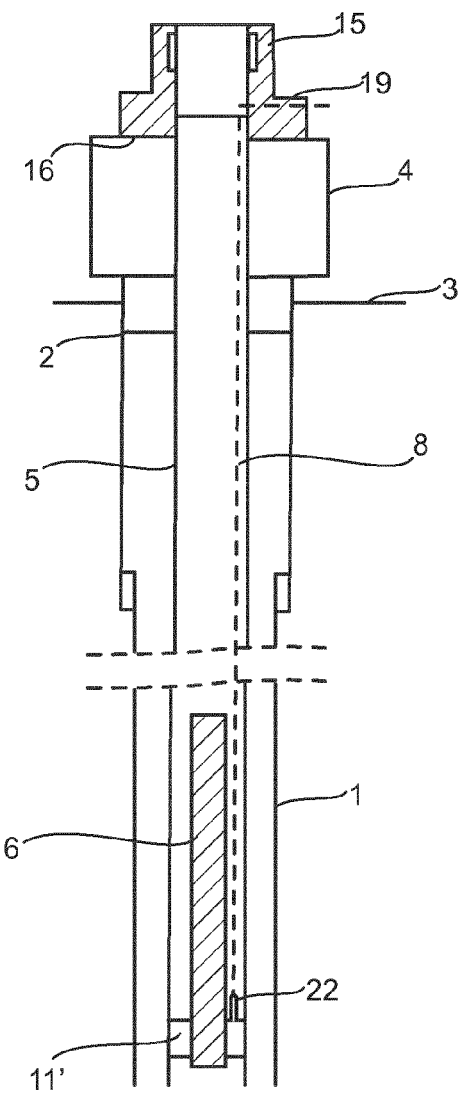
FIG. 3 shows the novel arrangement with a conventional cable.

FIG. 3 shows the general principles of a preferred embodiment of the novel ESP arrangement. For further understanding is referred to the co-pending patent application filed on the same date as the present, and which bears the title "Electrically submersible pump (ESP) arrangement". That application is incorporated herein by reference.

FIG. 3 shows several of the same elements as in FIGS. 1 and 2. The same reference numbers have been retained for elements that are substantially similar, such as the casing 1, the wellhead 2, the seabed 3, the Christmas tree 4, the production tubing 5, the pump unit 6 and the power and signal cable 8.

The pump unit is landed in a docking station 11', which is similar to the docking station 11 of FIG. 2, but does not include a penetration of the production tubing 5. The docking station 11' may nevertheless be installed together with the production tubing. Alternatively, it may be installed at a later stage by securing it to the inside surface of the production tubing, as will be generally known to the person of skill.

The cable 8 is connected to the docking station 11' at the inside of the production tubing 5 via connectors 22. The docking station includes a wet mate connector (not shown) for electrically connecting the pump unit 6 with the docking station 11' and hence the cable 8. The cable 8 extends along the production tubing 5 on the inside of the production tubing 5 from the docking station 11' through the wellhead 2 and through the Christmas tree 4.

At the top of the Christmas tree is connected an adapter 15. The adapter 15 has a lower first interface 16, which is adapted to mate with a corresponding interface 17 on the top of the Christmas tree 4. At the top of the adapter 15 is an upper second interface 18, which is identical to the interface 17 on top of the Christmas tree 4.

The adapter 15 has a feed-through 19 for the power and signal cable 8, which goes through the adapter to the surface or alternatively connects with a wet mate connector on the outside of the adapter 15.

Figure 4:
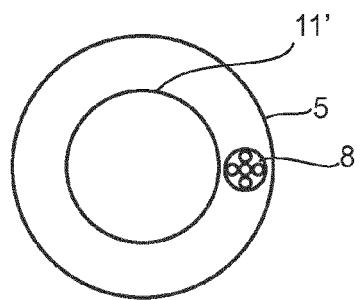
FIG. 4 shows the novel arrangement with a per se conventional cable in cross-section.

FIG. 4 shows a cross-section of the production tubing 5 and the pump unit 11' showing that there is little room between the two for a conventional cable 8.

Figure 5:
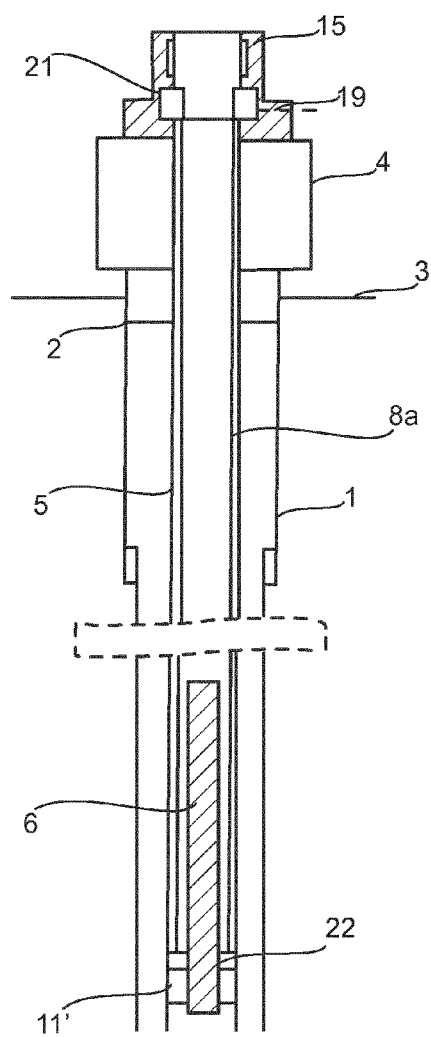
FIG. 5 shows a first embodiment of the cable of the invention in longitudinal section.
Figure 6:
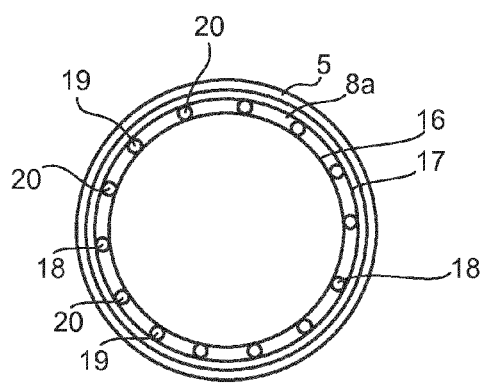
FIG. 6 shows the first embodiment in cross-section.

FIGS. 5 and 6 show a first embodiment of the cable 8a of the present invention. FIG. 5 shows the arrangement in longitudinal section and FIG. 6 shows the production tubing 5 and the cable 8 in cross section.

The cable 8a of the invention comprises an inner sleeve 16 and an outer sleeve 17, between which are arranged power lines 18 and signal lines 19, as well as braided wires 20, which serves to strengthen the cable 8a longitudinally. The outer sleeve 17 and the inner sleeve 16 are preferably made from high strength fibres, such as nylon, glass, carbon or Kevlar®. The inner sleeve should be particularly robust against the erosion caused by the well flow, which may contain sand and small bits of rock. An inner lining of a non-abradable material, such as Kevlar® or stainless steel braid, may be provided on the inside of the inner sleeve.

The outer sleeve 17 of the cable 8a has a diameter that is slightly less that the inner diameter of the production tubing 5 and the inner sleeve has a diameter that it slightly larger that the outer diameter of the pump unit 6. Thereby the cable 8 can extend through the narrow gap between the pump unit 6 and the production tubing 5.

At the top, the cable 8a is attached to a plug 21 or a threaded, or otherwise attached, insert that has been fixed to the inside of the adapter 15. At the bottom, the cable 8a is mated with the docking station 11' by appropriate connectors 22. The plug 21 has an internal diameter that is about the same as the diameter of the inner sleeve 16. Thereby, a space, i.e. a hollow core, is created within the cable that allows for the installation and retrieval of the pump unit, while the cable remains in place.

The cable 8, docking station 11' and the adapter 15 are installed as one assembly, while the pump unit 6 may be installed in a later step.

Figure 7:
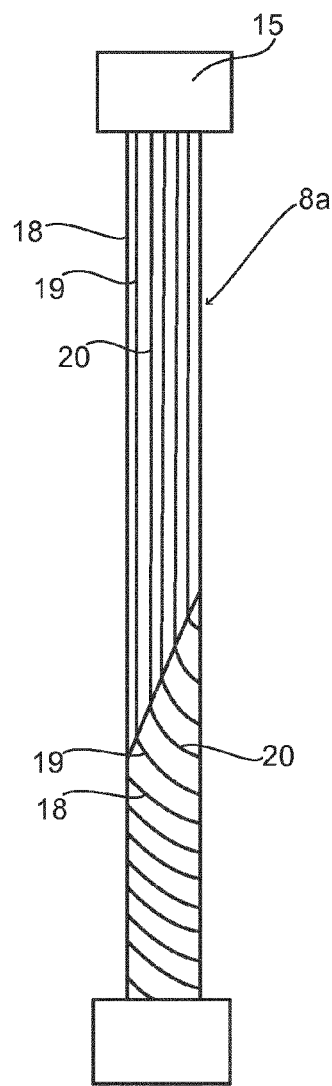
FIG. 7 shows the principles of the windings of the cable according to the first embodiment.

FIG. 7 shows the cable 8 in more detail. It shows the adapter 15 to which the cable is attached and the connector 22 that connects the cable with the docking station 11'. In the upper part of FIG. 7, the cable has been stripped of the outer sleeve 17 so that the longitudinal lines 18, 19 and wires 20 are visible. At the lower part of the figure, the lines 18, 19 and wires 20 are bent into extending in a helical fashion, or in a Z-winding, for the rest of the length of the cable 8. This provides the cable 8 with some degree of longitudinal compliance, so that it can accommodate to longitudinal expansion of the production tubing due to increasing temperature. As the wires 20 extend longitudinally in the upper part of the cable 8, where the strain from the weight of the cable 8 is largest, the wires 20 will still take up the weight of the cable where it is needed. Consequently, this configuration will provide both high tensile strength of the cable and compliance with longitudinal expansions and contractions.

The inner sleeve 16 and outer sleeve 17 may comprise fibres that extend longitudinally or are wound in a helical fashion around the lines and wires. The sleeves may also comprise both fibres that extend longitudinally and that extend helically. The helical winding of the fibres, or alternatively, Z-winding or other per se known fashions of winding, provides localised flexibility to the cable 8, making it easier to reel the cable 8 onto a reel with relatively small diameter.

Figure 8:
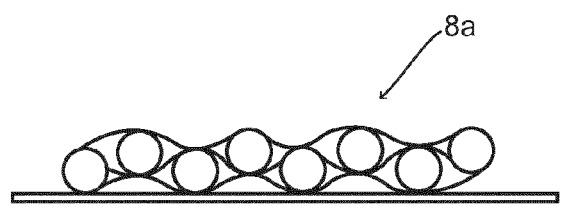
FIG. 8 shows a cross section of the cable of the first embodiment in a collapsed state.
Figure 9:
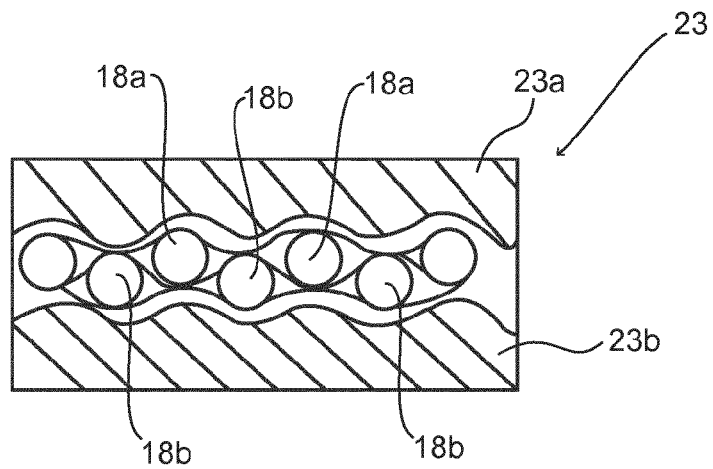
FIG. 9 shows a cross section of a tool for collapsing the cable.

FIG. 8 illustrates the possibility of making the cable 8 collapsible, to facilitate reeling up of the cable 8 in a more compact manner. To facilitate this, the cable is fed through a spooling device 23 that comprises two opposing jaws 23a and 23b, as shown in FIG. 9. The jaws define an undulating gap between one another. When the cable is fed between the jaws 23a, 23b the lines 18, 19 and wires 20 are gently pushed towards each other and into a staggering pattern, where lines/wires from opposing sides of the cable 8 comes to rest between each other so that a wire/line 18a from one side of the cable is arranged between two wires/lines 18b from the opposite side of the cable 8. The inner and outer sleeves 16, 17 are made flexible enough to allow for this collapse. It may also be resilient enough to expand the cable again when the cable 8 is reeled off the reel. However, expansion of the cable can be done by insertion of the pump unit or by the well flow through the centre of the cable.

Figure 10:
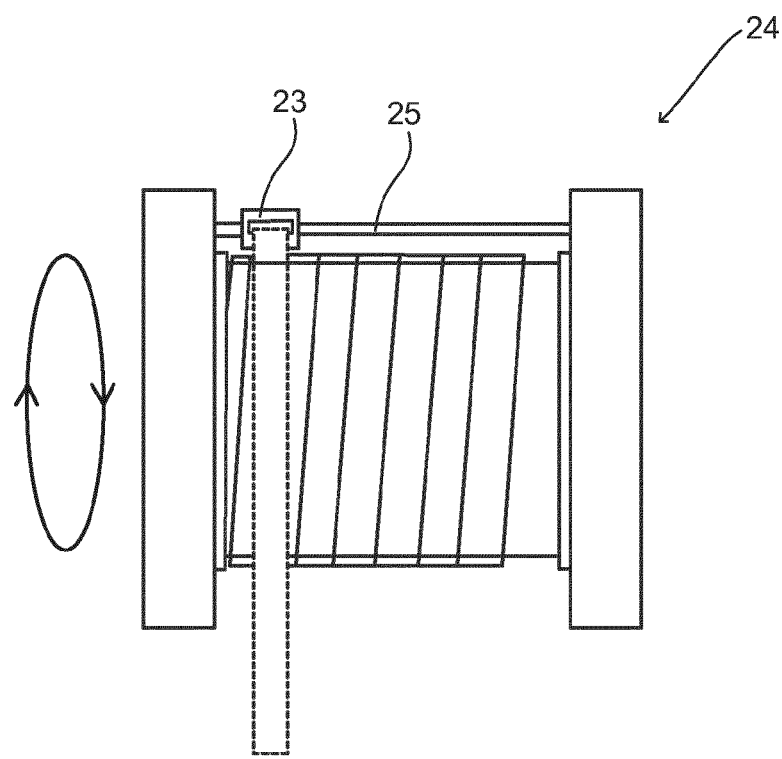
FIG. 10 shows a reel for reeling up the collapsed cable.

FIG. 10 shows a reel 24 incorporating the spooling device 23. The spooling device 23 is moveable along a track 25 in order to position the cable correctly on the reel 24, as generally known per se.

Figure 11:
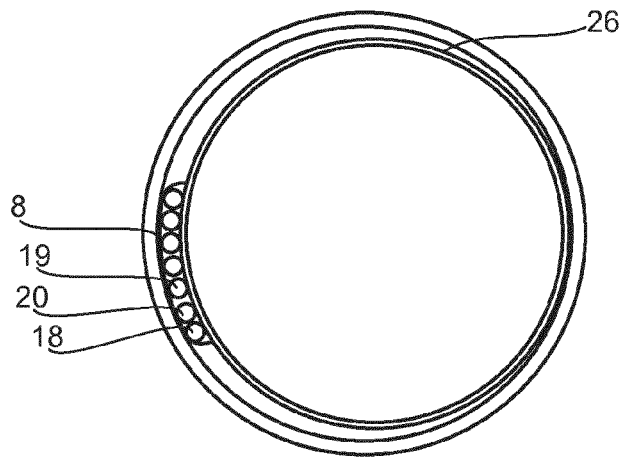
FIG. 11 shows a cable according to a second embodiment in cross-section.

FIG. 11 illustrates the principles of a second embodiment of the invention. In this embodiment all the lines 18, 19 and wires 20 have been positioned on one side. This configuration is similar to a flat liner umbilical (as used for Landing String systems). The cable 8 can be held against the wall by the use of a structural radially acting spring support 26 that is integrated with or attached to the cable. This spring-like support 26 can take the form of discrete rings, a spiral, running the length of the cable 8 or a continuous sleeve. The spring-like support is, as for the sleeves in the first embodiment, flexible enough to collapse in a flat manner.

The spring-like support could be replaced with special materials like smart materials or shape memory alloys. These alloys will change the shape in a controlled manner if they are given external stimuli such as temperature, stress, moisture, electricity, etc. This could be utilised to give it a flat structure while spooled on the reel and while being deployed, and once the stimuli is given (e.g. the temperature in well increases), the shape could be changed to the round cross-section shown in FIG. 11, pushing the umbilical against the inside of the production tubing 5.

Figure 12:
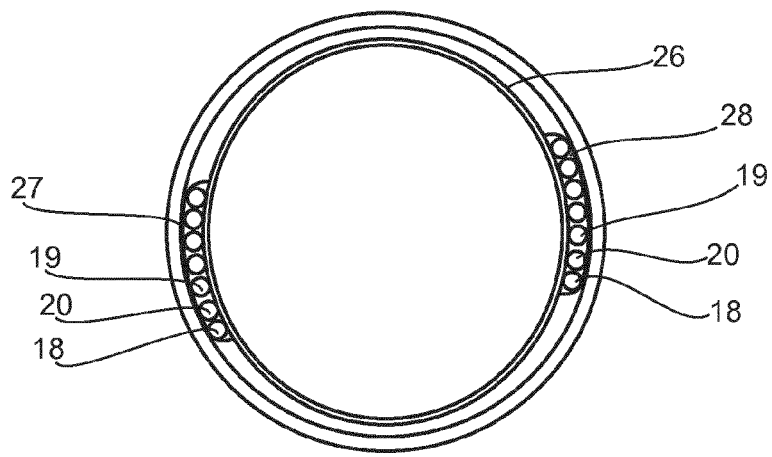
FIG. 12 shows a cable according to a third embodiment in cross-section.

FIG. 12 shows an embodiment similar to FIG. 11, but here the lines 18, 19 and wires 20 are arranged in two clusters 27, 28 on opposite sides of the spring-like support 26. Of course, the lines 18, 19 and wires 20 may be arranged in more than two clusters.

The spring-like support 26 may also be semi-circular or have other convenient shapes that act to push the cable against the production tubing while leaving a large empty void in the centre.

Figure 13:
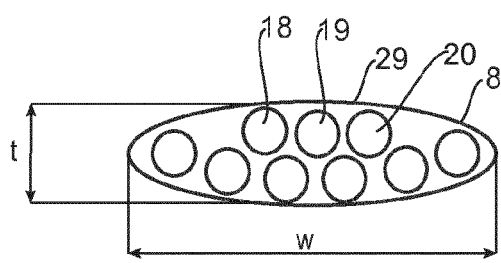
FIG. 13 shows a cable according to a fourth embodiment in cross-section.

FIG. 13 shows a fourth embodiment of the cable 8. In this embodiment, the lines 18, 19 and wires 20 are arranged in a generally flat cross-section and are enclosed by an outer sleeve 29. The thickness t of this cable should be sufficiently small to fit easily within the narrow gap between the pump unit 6 and the production tubing 5. The width w of the cable 8 is substantially larger than the thickness, such as 2-5 times as wide. The cable 8 may also be curved by a curvature similar to the annulus between the pump unit 6 and the production tubing 5.

Especially for this embodiment, it may be provided with magnets integrated into the cable to hold the cable 8 against the production tubing 5. The strength of the magnets would be chosen so that it does would not prevent the umbilical from entering the well, but would be strong enough to keep the umbilical against the wall during flowing of the well. Alternatively, electro-magnets may be used, which are activated when the cable has been installed inside the production tubing.

The cable may also have a geometry (e.g. be provided with fins or texture) that will push the umbilical to the wall during when subjected to the well flow. Both this technique and the magnets may be used on the first to third embodiments, described above.

Although being described specifically used to provide power, signal, and possibly hydraulics to an ESP, the principles of the cable of the present invention can also be used in other applications—for example, as a combined annulus hose and umbilical, a flexible riser with integrated umbilical, etc.

By ensuring that the cable is held against the inside of the production tubing, the risk of damage to the cable is reduced. It will prevent the cable from fluttering in the flow, which over time may wear down the cable.

The invention claimed is:

1. A cable arrangement for feeding power and signals to downhole equipment within an oil or gas well, the cable arrangement comprising:
   an upper suspension element,
   a lower connector,
   a docking station for the downhole equipment coupled to said connector, and
   a cable comprising lines for power and signal, and extending between and being coupled to said upper suspension element and said lower connector, wherein:
     said docking station is adapted for attachment to the inner surface of a production tubing,
     a gap is formed between said production tubing and said downhole equipment,
     said cable is shaped to fit inside said gap by having:
       a first dimension in the radial direction of said gap which is smaller than said gap, and
       a second dimension in the tangential direction of said gap, which is substantially larger than said first dimension.

2. The cable arrangement of claim 1, wherein said cable is ring-shaped with a central void that is at least as large as an outer dimension of said downhole equipment, and that said lines are distributed along a circumference of said cable.

3. The cable arrangement of claim 2, wherein said cable comprises an outer sleeve and an inner sleeve and that said lines are situated between said sleeves.

4. The cable arrangement of claim 3, wherein said sleeves comprises fibres that are wound helically.

5. The cable arrangement of claim 3, wherein said sleeves comprises fibres that extend longitudinally.

6. The cable arrangement of claim 1, wherein said cable is collapsible into a generally flat configuration for reeling onto a cable drum.

7. The cable arrangement of claim 6, wherein, when collapsed into the generally flat configuration, the lines on one side of the cable are pushed into gaps between lines on the opposite side of the cable.

8. The cable arrangement of claim 1, wherein said lines are placed in one or more clusters, each cluster having a semi-circular shape with a radius substantially the same as the gap between the downhole equipment and the production tubing.

9. The cable arrangement of claim 1, wherein said cable is attached to one or more ring-shaped or semi-ring-shaped spring elements that acts to push the cable against the inner surface of said production tubing.

10. The cable arrangement of claim 1, wherein said cable is attached to a helical spring element that acts to push the cable against the inner surface of said production tubing.

11. The cable arrangement of claim 8 wherein said spring element is made of a memory alloy.

12. The cable arrangement of claim 1, wherein said cable is equipped with at least one magnet that attaches said cable to the inner surface of the production tubing.

13. The cable arrangement of claim 1, wherein said cable has an outer geometry that creates a radial force when said cable is subjected to a well flow, in order to push said cable against the inner surface of said production tubing.

14. The cable arrangement of claim 1, wherein said cable comprises elongate strength elements.

15. The cable arrangement of claim 1, wherein the downhole equipment comprises an electrically submersible pump.

16. The cable arrangement of claim 3, wherein said sleeves comprises fibres that are wound as Z-winding.

* * * * *